United States Patent
Dalpee

[11] 3,931,550
[45] Jan. 6, 1976

[54] ELECTRONIC LATCHING RELAY CONTROL

[75] Inventor: Joseph A. Dalpee, New Carrollton, Md.

[73] Assignee: The United States of America as represented by the Secretary of the Navy, Washington, D.C.

[22] Filed: Nov. 25, 1974

[21] Appl. No.: 526,999

[52] U.S. Cl. .................. 317/148.5 R; 317/DIG. 4
[51] Int. Cl.² ........................................ H03H 9/00
[58] Field of Search ........ 317/123, 148.5 R, 135 R, 317/135 A, 149, DIG. 4

[56] References Cited
UNITED STATES PATENTS
3,267,482  8/1966  Moore, Jr. .................. 317/DIG. 4

Primary Examiner—R. N. Envall, Jr.
Attorney, Agent, or Firm—R. S. Sciascia; A. L. Branning; N. V. Brown

[57] ABSTRACT

A circuit for latching and unlatching of a relay by use of only one control line and a unipolar pulse. The circuit causes an associated relay to alternately latch and unlatch upon receipt of each unipolar pulse.

2 Claims, 1 Drawing Figure

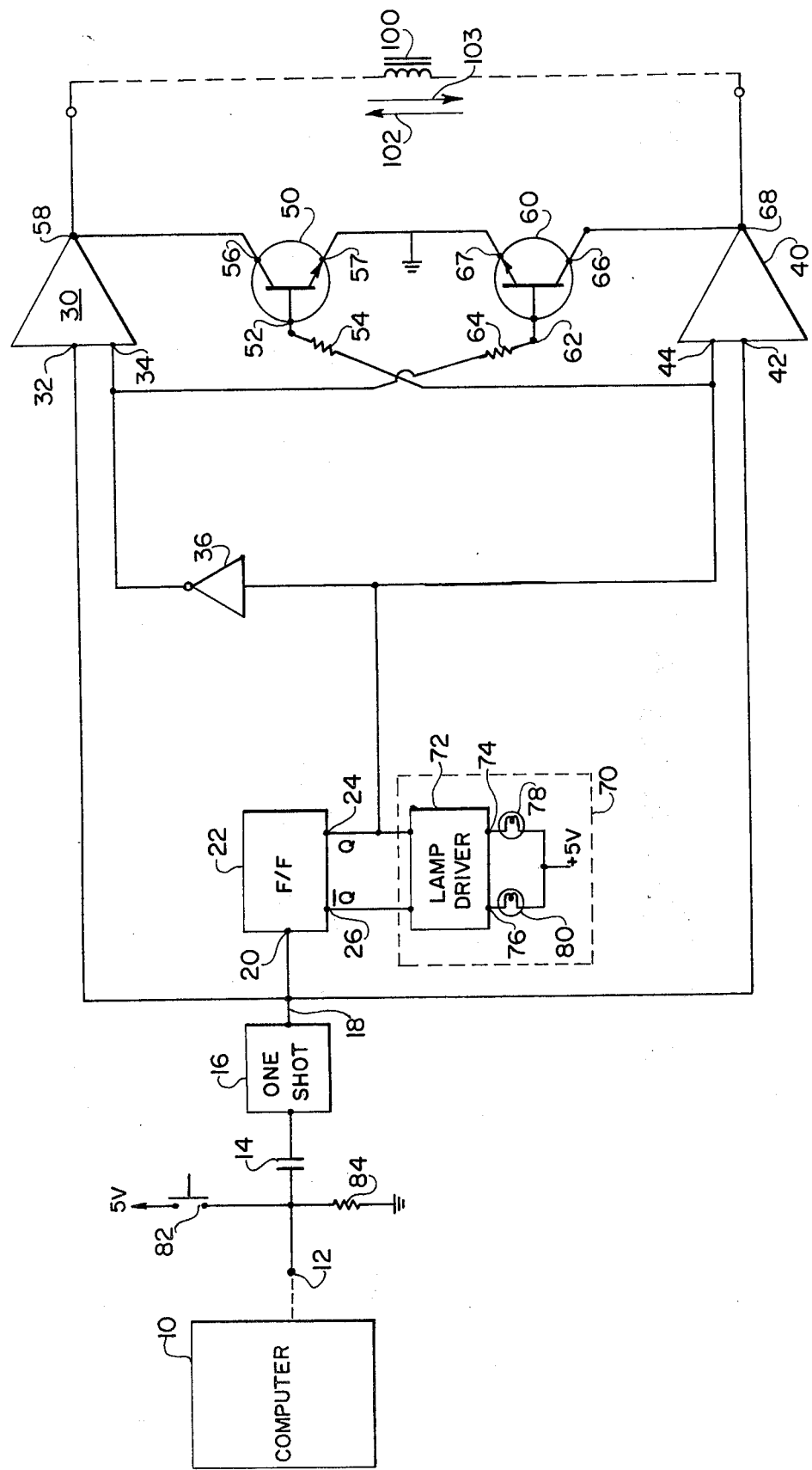

ELECTRONIC LATCHING RELAY CONTROL

BACKGROUND OF THE INVENTION

The present invention relates to switching apparatus and more particularily to latching switching circuits which may be controlled by a unipolar pulse in conjunction with only one control line (in addition to a ground line).

Although in most instances, it is desirable to minimize the number of lines necessary to control operation of the switching circuit and to operate a switching circuit with only pulses of a unipolar nature, previous switching methods generally have required a polarity reversing switch used in conjunction with a bipolar signal. Alternatively, they have required use of two control lines (in addition to a ground line).

The present invention overcomes the prior inefficiencies and disadvantages inherent in utilization of more than one control line or bipolar pulses.

SUMMARY OF THE INVENTION

The present invention is a switching circuit which functionally performs as a double-throw latching relay controllable by a unipolar control pulse transmitted on only one control line (in addition to a ground line).

Each control pulse triggers a change in state of a bistable device utilized in conjunction with logic circuitry. The logic circuitry controls the state of output driving devices. An associated voltage actuated device may be coupled to the outputs of the output driving devices.

DESCRIPTION OF THE DRAWING

The FIGURE is a functional-schematic diagram of an embodiment of the present invention.

DETAILED DESCRIPTION

A computer 10 or other device capable of producing a unipolar pulse is connected to an input terminal 12 of the embodiment of the present invention. A capacitor 14 is connected between the input terminal 12 and an input terminal of a "one-shot" or pulse producing device 16. An output terminal 18 of one-shot device 16 is connected to an input terminal 20 of a flip-flop device 22. Flip-flop 22 has first and second output terminals 24 and 26 for signals Q and $\bar{Q}$ respectively.

An AND-driver device 30 (which is a combination of an AND device and an amplifier) has a first input terminal 32 connected to one-shot output terminal 18, and a second input terminal 34 connected to the output of an inverting amplifier 36 whose input is connected to first flip-flop output terminal 24. In a similar manner a second AND-driver device 40 has a first input terminal 42 connected to one-shot output terminal 18, and a second input terminal 44 connected to first flip-flop output terminal 24.

An output driving transistor 50 has its base terminal 52 connected through a resistor 54 to second AND-driver input terminal 44. A collector terminal 56 of driving transistor 50 is connected to an output terminal 58 of first AND-driver 30, while the emitter terminal 57 of transistor 50 is connected to ground. A second output driving transistor 60 has its base terminal 62 connected through a resistor 64 to the AND-driver second input terminal 34, while its emitter terminal 67 is connected to ground. The collector terminal 66 of second transistor 60 is connected to an output terminal 68 of the second AND-driver 40.

The AND-driver output terminals 58, 68 are adapted to receive the coil 100 of a latching relay.

As an optional addition, a switch position indicator circuit 70 may be included in the present invention. Indicator 70 is comprised of a latching flip-flop lamp driver 72 having two input terminals respectively connected to the first and second flip-flop output terminals 24 and 26. Flip-flop driver 72 has first and second output terminals 74 and 76. Indicator lights 78 and 80 each have one terminal connected to a + voltage source and the other terminals are respectively connected to output terminals 74 and 76.

Another optional addition to the present invention is a momentary contact switch 82 connected between a positive voltage source and input terminal 12. A resistor 84, used in conjunction with the switch 82, is connected between input terminal 12 and ground.

All elements utilized in the embodiment of the present invention are conventional integrated circuits. For example, the one-shot device 16 is a type MC 9601. The flip-flop 22 is a type SN 7474, while the latching flip-flop lamp-driver 72 is a type 7407. The inverting amplifier 36 is a type SN 7404. The two AND-drivers 30, 40 are each a type NH-0005-CN. The output driving transistors are each type 2N657.

In operation, a control pulse (typically 4 volts) is received at the input terminal 12. The positive going transition of the leading pulse edge is passed through capacitor 14 (which acts to block the dc component of the control pulse) causing one-shot device 16 to produce a fixed-duration output pulse. The duration of this pulse is adjustable to allow for varying characteristics of relay control coils that are to be used in conjunction with the present invention. In the embodiment of the present invention the duration the one-shot output pulse is typically chosen to be 40 mili-seconds. The associated latching relay coil 100 is a voltage actuated device, typically actuated in the voltage range of from 6 to 60 volts dc, and with device actuation current to 3 amps.

In response to a one-shot device output pulse, the state of output signals Q, $\bar{Q}$ of flip-flop 22 reverses (i.e. a "high" Q signal changes to "low," while a low $\bar{Q}$ signal changes to high). The inverting amplifier operates functionally as a logic signal inverter. That is to say, it changes a high level signal present at its input terminal to a low level signal at its output terminal, and conversely, changes a low level signal at its input terminal to a high level signal at its output terminal. Assume now that signal Q is high and signal $\bar{Q}$ is low.

The high Q signal passes through inverter 36 causing a low voltage signal at the inverter output. This low level inverter output signal is applied to the first AND-driver input terminal 34 and to the second transistor base terminal 62 (causing it to remain biased in a shut-off condition). The high signal Q is also applied to the second AND-driver second input terminal 44 and to the first transistor base terminal 52 providing it with a saturation bias voltage.

The signal pulse from one-shot 16, applied to the first AND-driver first input terminal 32, is of opposite level (i.e. low) as that of high Q signal at second input terminal 34. The opposite level signals applied to the first AND-driver 30 cause it to have a low output voltage. At the same time, the pulse from one-shot 16 is applied to the second AND-driver first input terminal 42. Since both AND terminals are high, the output voltage from second AND-driver 40 becomes high.

Current flows (in the direction of arrow 102) from second AND-driver output terminal 68, through the relay coil 100, the collector-emitter (of first output transistor driver 50), to ground, thereby energizing the relay coil in a first direction.

When the one-shot pulse goes to zero, both AND-drivers 30, 40 are caused to have a low output voltage, the output transistors 50, 60 then become non-conductive, and the relay coil current ceases.

A second control pulse causes bistable flip-flop 22 output signal Q to change to low, and complimentary signal $\bar{Q}$ to change to high. The low Q signal passes through inverter 36 causing a high voltage at the inverter output. This inverter high level output signal is applied to the first AND-driver input terminal 34 and to the second transistor base terminal 62, causing it to remain biased in a saturation condition. The low signal Q is also applied to the second AND-driver second input terminal 44, and to the first transistor base terminal 52 providing it with a cutoff bias voltage.

The signal pulse from one-shot 16, applied to the first AND-driver first input terminal 32 is of the same level (i.e. high) as that of the inverted low Q signal at second AND-driver second input terminal 34. The high level signals applied to first AND-driver 30 causes it to have a high output voltage. At the same time, the pulse from one-shot 16 is applied to the second AND-driver first input terminal 42. Since signals levels at the input terminals of second AND-driver 40 input terminals are of opposite signal level, the output voltage of second AND-driver 40 will be low. The above described reversal of signals Q, $\bar{Q}$ thus results in establishing an activating voltage (across the voltage actuated device 100) and a sustaining current (arrow 103) in the direction opposite to that established before the control pulse causing reversals of signals Q, $\bar{Q}$. Of course the opposite direction of current in relay coil 100 causes associated switch contacts to switch to opposite terminal sets.

The optional signal indicator 70 indicates the state of the output of flip-flop 22, which is indicative of the state of latching relay coil 100. A high Q signal from first output terminal 24 applied at a corresponding input of latching flip-flop lamp driver 72 causes corresponding light bulb 78 to light. Alternately, a high $\bar{Q}$ (corresponding to a low Q signal) signal from second output terminal 26 (applied at the corresponding input of latching flip-flop lamp driver 72) causes a corresponding light bulb 80 to light.

It should be noted that when compared to the level of the output signal Q, the signal at the output of the inverting amplifier 36 is of the same level as that at the complimentary output signal $\bar{Q}$. Therefore the inverting amplifier 36 could be omitted and connections made to its output terminal then would be connected to bistable flip-flop complimentary output signal terminal 26.

The optional switch arrangement may be used to manually trigger the switching function of the embodiment of the present invention. Closing of switch 82 causes a connection of resistor 84 to the voltage source, resulting in a control signal present at input terminal 12. The positive going transition of this signal is treated in the same way and has the same affect as the previously described control signal.

Obviously many modifications and variations of the present invention are possible in light of the above teachings. It is therefore to be understood that within the scope of the appended claims the invention may be practiced otherwise than as specifically described.

What is claimed and desired to be secured by letters patent of the United States is:

1. A switching control circuit for providing, under control of a control signal, actuating voltages and sustaining currents for actuating a voltage actuated device comprising:

conditioning means for producing an output pulse upon the occurence of said control signal;

bistable means connected to the output of said conditioning means for providing an output signal and complimentary output signal respectively to an output terminal and a complimentary output terminal, each of said output signals having complimentary values at a given time, said values alternating upon the occurence of said output pulse;

first AND decision means for generating one of said actuating voltages, having a first input terminal coupled to the output of said conditioning means, a second input terminal coupled to said bistable means so as to energize said first AND-driver second input terminal with a high level signal only upon the occurence of said complimentary output signal, and an output terminal;

second AND decision means for generating one of said actuating voltages, having a first input terminal coupled to the output of said conditioning menas, a second input terminal coupled to said bistable means so as to energize said second AND-driver second input terminal with a high level signal only upon the occurence of said output signal, and an output terminal;

first output means for providing one of said sustaining currents, having a control terminal coupled to said second AND-driver second input terminal and having output terminals connected between the circuit ground and said first AND decision means output terminal;

second output means for providing one of said sustaining currents, having a control terminal coupled to said first AND-driver second input terminal and having output terminals connected between the circuit ground and said second AND decision means output terminal;

means connected to said output and complimentary output signal terminals for indicating the state of said output and complimentary output signals; and means connected to the input of said conditioning means for producing a control signal;

whereby said first AND decision means produces an actuating voltage establishing current through said voltage actuated device in a first direction only upon the joint occurence of said output pulse and said complimentary signal, and whereby said second output means is in a conducting state and supplies a sustaining current through said voltage actuated in said first direction only during the occurence of said complimentary output signal, and further whereby said second AND decision means produces an actuating voltage establishing current through said voltage actuated device in a second direction only upon the joint occurence of said output pulse and said output signal, and whereby said first output means is in a conducting state and supplies a sustaining current in said second direction only during the occurence of said output signal.

2. A switching control circuit for providing, under control of a control signal, actuating voltages and sustaining currents for a voltage actuated device comprising:

a one-shot device generating a predetermined fixed duration output pulse at an output terminal upon the occurence of a control signal received at its input terminal;

bistable means coupled to the output of said one-shot device producing alternate output and complimentary output signals at respective first and second output terminals;

a first AND-driver device having a first input terminal coupled to said one-shot device output terminal, and a second input terminal coupled to said bistable means so as to energize said first AND-driver second input terminal with a high level signal only upon the occurence of said complimentary output signal, and an output terminal;

a second AND-driver device having a first input terminal coupled to said one-shot device output terminal, and a second input terminal coupled to said bistable means so as to energize said second AND-driver device second input terminal with a high level signal only upon the occurence of said output signal, and an output terminal:

a first output transistor having a base terminal coupled through a resistor to said second AND-driver second input terminal, a collector terminal coupled to said first AND-driver device output terminal, and an emitter terminal coupled to the circuit ground; and a second output transistor having a base terminal coupled through a resistor to said first AND-driver device second input terminal, a collector terminal coupled to said second AND-driver device output terminal, and an emitter terminal coupled to the circuit ground;

whereby said first AND-driver device produces an actuating voltage establishing current through said voltage actuated device in a first direction only upon the joint occurence of said output pulse and said bistable device complimentary signal, and whereby said second output transistor is in a conducting state and supplies a sustaining current in said first direction only during the occurence of said bistable device complimentary signal and further whereby said second AND-driver device produces an actuating voltage establishing current through said voltage actuated device in a second direction only upon the joint occurence of said output pulse and said bistable device output signal, and whereby said first output transistor is in a conducting state and supplies a sustaining current in said second direction only during the occurence of said bistable device output signal.

* * * * *